United States Patent
Ennis et al.

(10) Patent No.: US 10,247,767 B2
(45) Date of Patent: Apr. 2, 2019

(54) FAULT DETECTION AND DIRECTION DETERMINATION

(71) Applicant: S&C Electric Company, Chicago, IL (US)

(72) Inventors: Michael Ennis, Evanston, IL (US); Adam Gardner, Chicago, IL (US); Alejandro Montenegro, Chicago, IL (US); Yoav Sharon, Evanston, IL (US)

(73) Assignee: S&C Electric Company, Chicago, IL (US)

( * ) Notice: Subject to any disclaimer, the term of this patent is extended or adjusted under 35 U.S.C. 154(b) by 293 days.

(21) Appl. No.: 14/956,125

(22) Filed: Dec. 1, 2015

(65) Prior Publication Data

US 2016/0266193 A1    Sep. 15, 2016

Related U.S. Application Data

(60) Provisional application No. 62/085,961, filed on Dec. 1, 2014.

(51) Int. Cl.
*G01R 31/08* (2006.01)
*H02H 7/22* (2006.01)
*H02H 3/38* (2006.01)

(52) U.S. Cl.
CPC ......... *G01R 31/086* (2013.01); *G01R 31/088* (2013.01); *H02H 7/22* (2013.01); *H02H 3/385* (2013.01)

(58) Field of Classification Search
CPC ...... G01R 31/086; G01R 31/088; H02H 7/22; H02H 3/385

USPC .......................................................... 702/58
See application file for complete search history.

(56) References Cited

U.S. PATENT DOCUMENTS

| | | | |
|---|---|---|---|
| 5,349,490 A | | 9/1994 | Roberts et al. |
| 5,365,396 A | * | 11/1994 | Roberts ................. H02H 3/402 |
| | | | 361/80 |
| 5,559,418 A | * | 9/1996 | Burkhart .................. H02P 1/44 |
| | | | 318/781 |
| 5,694,281 A | | 12/1997 | Roberts et al. |
| 5,764,044 A | | 6/1998 | Calero |
| 6,721,671 B2 | | 4/2004 | Roberts |
| 2004/0064272 A1 | | 4/2004 | Ennis et al. |
| 2007/0285857 A1 | | 12/2007 | Berkowitz et al. |

OTHER PUBLICATIONS

Tom Short, Fault Location on Distribution Systems: An Update on EPRI and DOE Research, IEEE Distribution Subcommittee presentation, Jan. 10, 2007, Orlando, FL.

(Continued)

*Primary Examiner* — Sujoy K Kundu
*Assistant Examiner* — Lynda Dinh

(57) ABSTRACT

Methods and apparatus are provided for fault detection and direction determination with a phase overcurrent relay using individual phase torques and the negative sequence torque, and with a ground overcurrent relay using the zero sequence torque. A directional element includes a ground element logic circuit, a negative element logic circuit and a phase element logic circuit to evaluate the operation state of the system, detect a fault condition and determine the direction of the fault condition in an electrical power distribution system having multiple sources on a power grid.

6 Claims, 6 Drawing Sheets

(56) References Cited

OTHER PUBLICATIONS

Hassan Nouri, et al., Comprehensive Distribution Network Fault Location Using the Distributed Parameter Model, IEE Transactions on Power Delivery, Oct. 2011, vol. 26.

John Horak, Directional Overcurrent Relaying (67) Concepts, 59th Annual Conference for Protective Relay Engineers, Basler Electric, 2006 IEEE Rural Electric Power Conference, Apr. 9-11, 2006, Albuquerque, NM, pp. 164-176.

Seongchul Kwon, et al, Evaluation of Protection Coordination With Distributed Generation in Distribution Networks, Korea Electric Power Research Institute, South Korea. 10th IET International Conference on Developments in Power System Protection (DPSP 2010). Managing the Change, Mar. 29-Apr. 1, 2010, Manchester, UK, pp. 1-5.

Distribution System Feeder Overcurrent Protection, GE Power Management, Publication No. GET-6450, Aug. 5, 1997, GE Power Management, 215 Anderson Ave., Markham, Ont. Canada L6E 1B3, www.GEindustrial.com/pm, pp. 1-24.

Jeff Roberts, et al., Directional Element Design and Evaluation, Schweitzer Engineering Laboratories, Inc., Pullman, WA, USA. Originally presented at the 21st Annual Western Protective Relay Conference, Oct. 1994. Revised editions released Jul. 2000, Feb. 2003, and Aug. 2006, pp. 1-27.

Karl Zimmerman, et al., Impedance-Based Fault Location Experience, Schweitzer Engineering Laboratories, Inc., Pullman, WA, USA, 58th Annual Conference for Protective Relay Engineers, Apr. 5-7, 2005, College Station, TX, pp. 1-27.

D. Daniel Sabin, et al., Overview of an Automatic Distribution Fault Location System, Electrotek Concepts, Inc. and Consolidated Edison Company of New York, 2009 IEEE Power & Energy Society General Meeting, Jul. 26-30, 2009, Calgary, AB, Canada, pp. 1-7.

International Search Report and Written Opinion for International Application No. PCT/US2015/063258 dated Feb. 16, 2016. (8 pages).

* cited by examiner

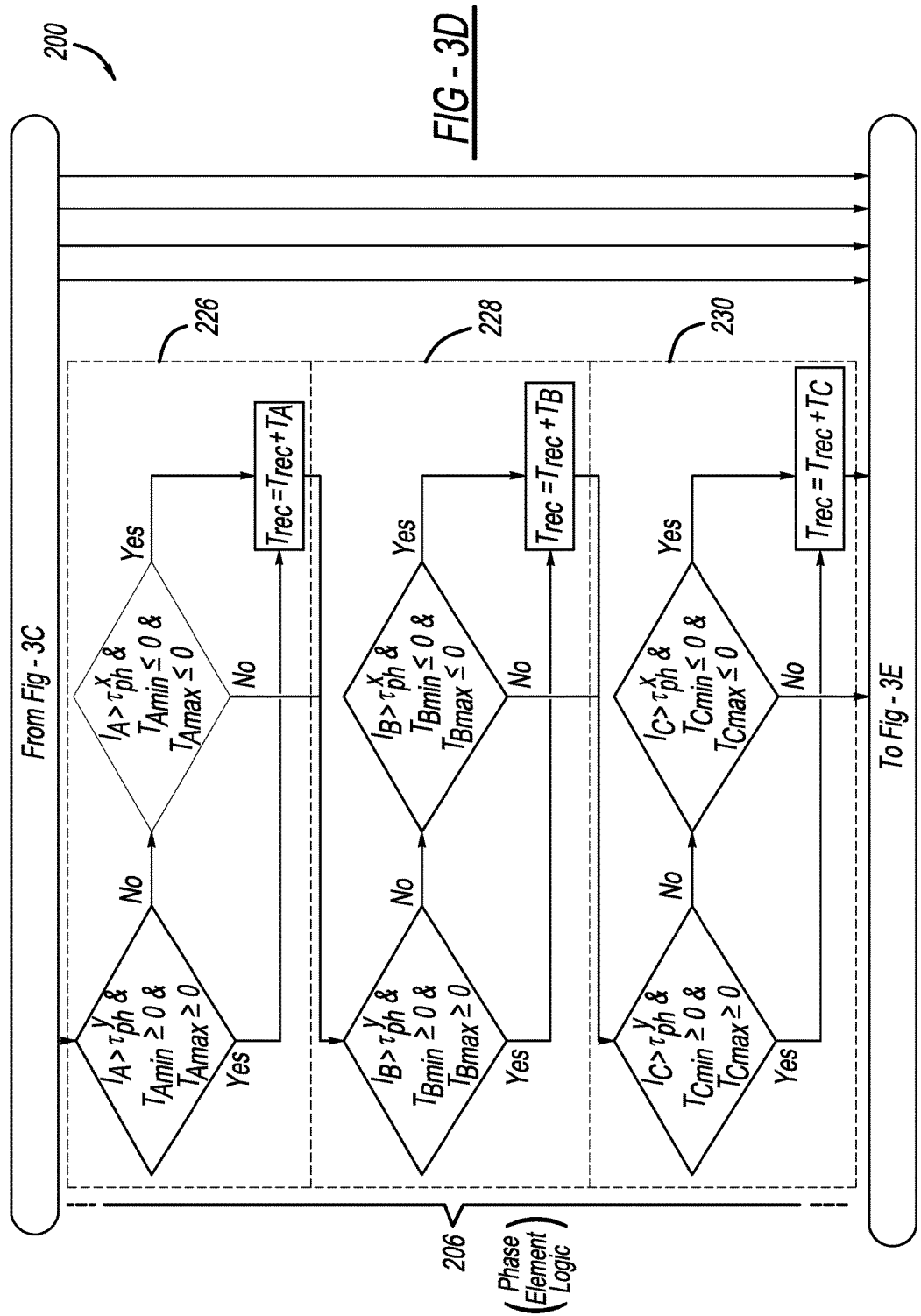

FAULT DETECTION AND DIRECTION DETERMINATION

CROSS-REFERENCE TO RELATED APPLICATIONS

This application claims the benefit of U.S. Provisional Application No. 62/085,961, filed on Dec. 1, 2014. The entire disclosure of the above application is incorporated herein by reference.

TECHNICAL FIELD

The present disclosure relates to electric power distribution systems, and more particularly, to an apparatus and method to determine a direction of the fault relative to a directional element upon occurrence of a fault within an electric power distribution system.

BACKGROUND

This section provides background information related to the present disclosure, which is not necessarily prior art.

To determine fault direction, directional elements use the concept of torque. In digital relays the torque is computed with the current and voltage phasors, which are in turn calculated using discrete Fourier transform from the output signals of the current and potential transformers of the relay. There are six basic torques that are commonly used—a phase torque for each of the three phases, as well as the positive, negative, and zero sequence torques.

Directional elements are needed within electric power distribution systems to differentiate between load current and fault current when two or more sources are present in the distribution network. When a fault current is about two- or three-times the load current, this is easy to accomplish. But when the directional element is used in a relay that is protecting a distributed generation source, much lower fault current may need to be detected to identify the fault direction correctly. Moreover, certain limitations are recognized for individual phase torques with a particular torque angle, and of the positive sequence torque in general, particularly in distributed generation systems.

Accordingly, it is desirable to provide fault detection and fault direction determination with a phase overcurrent relay using individual phase torques and the negative sequence torque, and with a ground overcurrent relay using the zero sequence torque. It is also desirable to provide a device utilizing minimum pickup thresholds that will assure correct operation of the directional elements. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The drawings described herein are for illustrative purposes only of selected embodiments and not all possible implementations, and are not intended to limit the scope of the present disclosure.

FIGS. 3C-3E is a flow chart showing a phase element logic algorithm executed by the directional element for fault detection and direction determination.

Corresponding reference numerals indicate corresponding parts throughout the several views of the drawings.

DETAILED DESCRIPTION

Figure 1:
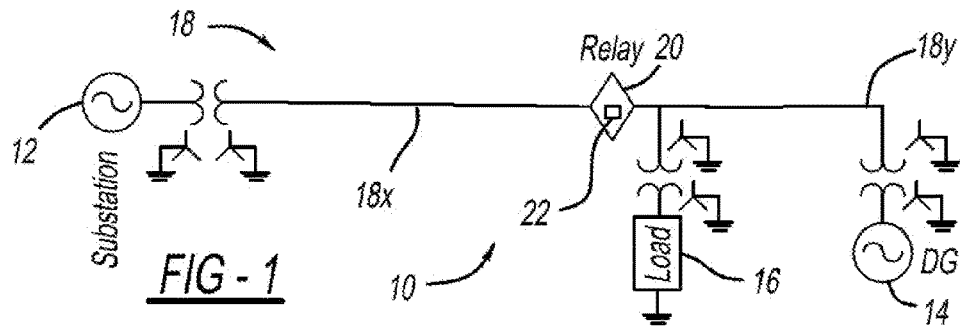
FIG. 1 shows a schematic representation of an electric power distribution system having multiple power sources.

In accordance with the present disclosure, fault detection and fault direction determination is achieved with a phase overcurrent relay using individual phase torques and the negative sequence torque, and with a ground overcurrent relay using the zero sequence torque. Also disclosed is a device utilizing minimum pickup thresholds that will assure correct operation of the directional element.

The directional element can be installed at any point on a three-phase distribution network line. Using real-time three-phase voltage and current measurements, and few inputs supplied by the protection engineer, the device can identify if a fault occurred, and if yes, the direction to the fault from the installation point. It may be used with other devices such as relays, switches and fault interrupters in order to assist with fault protection, isolation and automatic system restoration.

Improvement over similar available devices is realized in the need for very minimal manual setup, the ability to detect direction to faults where fault current is only slightly higher than load current, and the ability to detect direction to faults in systems with more than one source. Finally, the device can also distinguish between real signal originating from the electric network, and phantom signal due to noise in the sensors system.

While conventional directional elements can use different torques (phase torques, positive sequence torque, zero sequence torque, negative sequence torque) to determine the direction to the fault, at least some of these torques may not indicate the direction of the fault in many instances due to the presence of load and/or measurement noise in the system. The improvements listed above are achieved by in a directional element that automatically selects in real-time which torque should be used. In addition, the directional element uses individual phase torques to achieve higher sensitivity.

As described, a directional element and method may detect a fault and determine its direction using negative sequence torque when the negative sequence voltage is high enough. Zero sequence torque may be used when both zero sequence current and voltage are strong enough. Otherwise, one or more individual phase torques may be used depending on voltage level and pickup threshold. Otherwise, a summation of the phase torques is used. An improvement of the described directional element and method is therefore the ability to detect fault on one side of the distribution network while large load exists on the other side of the distribution network. This is accomplished by the introduction of the individual phase torque to determine the direction. Additional modifications may be implemented to ensure that this improvement does not adversely affect the performance of the directional element.

A method of fault detection and direction determination is provided for a three-phase electric power distribution system having a gird including a first source on a first side of the grid and a second source on the second side of the grid. Initially, the current and voltage for each of the three power phases is measured at a location between the first and second side to determine an operational state of the electric power distribution system. The operational state is first evaluated using a ground element logic algorithm. A first fault condition in a direction of side X is indicated when a magnitude for a ground current is greater than an overcurrent ground threshold value for side X. A second fault condition in a direction of side Y is indicated when the magnitude for the ground current is greater than the overcurrent ground threshold value for side Y. A no fault condition is indicated when neither the first or second fault condition is indicated. The operational state is next evaluated using a negative element logic algorithm. The first fault condition is indicated when the magnitude for a negative sequence current is greater than an overcurrent negative threshold value for side. The second fault condition is indicated when the magnitude for the negative sequence current is greater than an overcurrent negative threshold value for side Y. The no fault condition is again indicated when neither the first or second fault condition is indicated.

Lastly, the operation state is evaluated using a phase element logic algorithm with a two-step approach—first, based on the maximum value of the magnitude for any of the phasor value currents, then second based on the torque for each of the phases. With the first step, the first fault is indicated when a maximum value of the magnitude of a phasor current for any of the three phases is greater than an overcurrent phase threshold value for side X. The second fault is indicated when the maximum value of the magnitude the phasor current for any of the three phases is greater than an overcurrent phase threshold value for side Y. When neither the first or second fault condition is indicated from the first step, the phase element logic algorithm evaluates the torque for each of the phases to detect a fault condition and determine the direction of the fault condition. A fault in the direction of side X may be indicated when the summation of the sequence torques values is less than zero or when the maximum value of the magnitude for any of the phasor currents is greater than the overcurrent phase threshold value for side X and the maximum value of any sequence torque value is less than or equal to zero. A fault in the direction of side Y may be indicated when the summation of the sequence torques values is equal to or greater than zero or when the maximum value of the magnitude for any of the phasor currents is greater than the overcurrent phase threshold value for side Y and the minimum value of any sequence torque value is equal to or greater than zero. If none of these conditions are satisfied, then a no fault condition is indicated.

A directional element is also provided for fault detection and direction determination in a three-phase electric power distribution system including a gird having a first source on the first side of the grid and a second source on the second side of the grid. The directional element is operable to evaluate the operational state of the electric power distribution system using a logic algorithm which establishes precedence between the ground, negative and phase elements for fault detection and direction determination. The directional element includes a ground element logic circuit configured to indicate a first fault condition in a direction of side X when a magnitude for a ground current is greater than an overcurrent ground threshold value for side X, a second fault condition in a direction of side Y when the magnitude for the ground current is greater than the overcurrent ground threshold value for side Y, and a no fault condition when neither the first or second fault condition is indicated. The directional element also includes a negative element logic circuit configured to indicate the first fault when the magnitude for a negative sequence current is greater than an overcurrent negative threshold value for side, the second fault condition when the magnitude for the negative sequence current is greater than an overcurrent negative threshold value for side Y, and the no fault condition when neither the first or second fault condition is indicated.

The directional element further includes a phase element logic circuit to detect the fault condition and determine the direction with a two-step approach—first, based on the maximum value of the magnitude for any of the phasor value currents, then second based on the torque for each of the phases. Initially with the first step, the phase element logic circuit indicate the first fault when a maximum value of the magnitude of a phasor current for any of the three phases is greater than an overcurrent phase threshold value for side X, the second fault when the maximum value of the magnitude the phasor current for any of the three phases is greater than an overcurrent phase threshold value for side Y. When neither the first or second fault condition is indicated from the first step, the phase element logic algorithm evaluates the torque for each of the phases to detect a fault condition and determine the direction of the fault condition. A fault in the direction of side X may be indicated when the summation of the sequence torques values is less than zero or when the maximum value of the magnitude for any of the phasor currents is greater than the overcurrent phase threshold value for side X and the maximum value of any sequence torque value is less than or equal to zero. A fault in the direction of side Y may be indicated when the summation of the sequence torques values is equal to or greater than zero or when the maximum value of the magnitude for any of the phasor currents is greater than the overcurrent phase threshold value for side Y and the minimum value of any sequence torque value is equal to or greater than zero. If none of these conditions are satisfied, then a no fault condition is indicated.

Example embodiments will now be described more fully with reference to the accompanying drawings. There is no intention to be limited by any principle presented in the preceding background or the following detailed description.

With reference now to FIG. 1, an electric power distribution system 10 is shown to include multiple sources 12, 14 and a load 16 residing on a power distribution network or grid 18. In this configuration, source 12 represents a substation on a first side 18$x$ (side X) of the electric power distribution system 10, and source 14 represent a distributed generator or DG on a second side 18$y$ (side Y) of the electric power distribution system 10. These sources 12, 14 provide three-phase power (A, B, C) to the load 16 through the electric power distribution system 10. The electrical power distribution system 10 further includes one or more switching devices or relays 20 having distributed intelligence for implementing real-time grid control to increase power distribution reliability from the sources 12, 14 over the grid 18 based on the operating conditions at the relay 20. With distributed intelligence, the relay 20 installed on the power grid may implement embedded controls to monitor local conditions. They also communicate with other relays or switches to get data on system conditions at other adjacent devices.

One form of distributed intelligence includes a directional element 22, which operates to detect the occurrence of a fault within an electric power distribution system 10 and determine a direction of the fault relative to the directional element 22. In particular, the directional element 22 analyzes data concerning the operational state of the grid 18 in real time to quickly determine the occurrence and direction of the fault. With this information the relay 20 may determine whether the relay 20 should operate to rapidly reconfigure the electrical power system 10 and restore power to the load 16.

Figure 2:
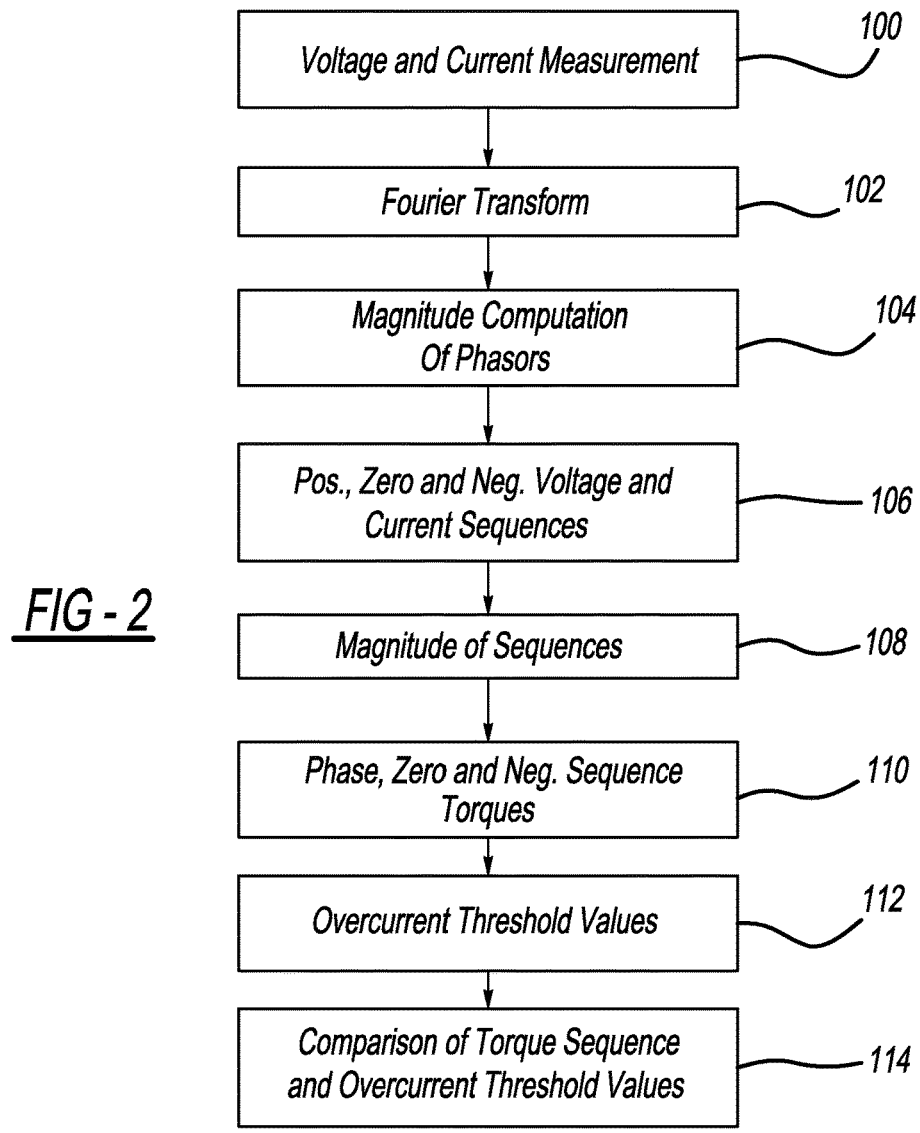
FIG. 2 is a process diagram representing a work flow for fault detection and direction determination in accordance with the present disclosure.

To determine fault direction, the directional element 22 uses the concept of torque. In a digital relay 20, torque may be computed with the current and voltage phasors, which are in turn calculated using discrete Fourier transform from the output signals of the current and potential transformers of the relay 20. With reference now to FIG. 2, the directional element 22 is provided with measurement signals at block 100 representing the current and voltage for each of the three power phases (A, B, C) at the relay 20. A Fourier transform at the system frequency is applied to the three current and three voltage measurements at block 102 resulting in six complex (phasor) values: $i_A$, $i_B$, $i_C$, $v_A$, $v_B$, $v_C$. The magnitude (absolute value) for each of the six phasors $I_A$, $I_B$, $I_C$, $V_A$, $V_B$, $V_C$ is computed at block 104. From the phasor values the positive, zero and negative sequence current and voltage, $i_0$, $i_1$, $i_2$, $v_0$, $v_1$, $v_2$, are computed at block 106, and the magnitude thereof $I_0$, $I_1$, $I_2$, $V_0$, $V_1$, $V_2$ are computed at block 108. With these computations complete, the phase torques ($T_A$, $T_B$, $T_C$), zero sequence torque ($T_{zero}$) and negative sequence torque ($T_{neg}$) are then computed as a function of the phasor values and a maximum torque angle (MTA) at block 110 according to the following equations:

$$T_{A_n} = Re(e^{-j \cdot MTAph} \cdot (v_A - v_0) \cdot i_A^*)$$

$$T_{B_n} = Re(e^{-j \cdot MTAph} \cdot (v_B - v_0) \cdot i_B^*)$$

$$T_{C_n} = Re(e^{-j \cdot MTAph} \cdot (v_C - v_0) \cdot i_C^*)$$

$$T_{Amin_n} = Re(e^{-j \cdot MTAmin} \cdot (v_A - v_0) \cdot i_A^*)$$

$$T_{Bmin_n} = Re(e^{-j \cdot MTAmin} \cdot (v_B - v_0) \cdot i_B^*)$$

$$T_{Cmin_n} = Re(e^{-j \cdot MTAmin} \cdot (v_C - v_0) \cdot i_C^*)$$

$$T_{Amax_n} = Re(e^{-j \cdot MTAmax} \cdot (v_A - v_0) \cdot i_A^*)$$

$$T_{Bmax_n} = Re(e^{-j \cdot MTAmax} \cdot (v_B - v_0) \cdot i_B^*)$$

$$T_{Cmax_n} = Re(e^{-j \cdot MTAmax} \cdot (v_C - v_0) \cdot i_C^*)$$

$$T_{neg_n} = -Re(e^{j \cdot MTAneg} \cdot v_2 \cdot i_2^*)$$

$$T_{zero_n} = -Re(e^{j \cdot MTAzero} \cdot v_0 \cdot i_0^*)$$

From the equations set forth above, it becomes apparent that the zero sequence voltage $v_0$ is subtracted from the complex values $v_a$, $v_b$, $v_c$ before computing the phase torques $T_A$, $T_B$, $T_C$.

Overcurrent threshold values for the phase sequence, ground or residual sequence and negative sequence may be defined as $\tau_{ph}^X$, $\tau_g^X$, $\tau_n^X$ for one side (side X) and $\tau_{ph}^Y$, $\tau_g^Y$, $\tau_n^Y$, for the other side (side Y) at block 112. If any one of the overcurrent threshold values is not defined, a default value may be set to infinity. The sides X and Y are defined such that the phasor of a phase current originating from a source on X to serve a purely resistive load on Y will have the same angle as the phase voltage phasor. A nominal line to ground voltage (RMS) may also be defined as $V_n$ at block 112.

Using these values, the directional element 22 compares the torque sequence values and the overcurrent threshold values at block 114 in accordance with the logic algorithm 200 depicted in FIGS. 3A-3E to determine the occurrence and direction of a fault within the electric power distribution system 10, wherein T>0 represent current flowing in a direction from side X to side Y, whereas T<0 represent current flowing in a direction from side Y to side X. Based on the operational state of the electric power generation system 10, logic algorithm 200 defines precedence between the ground, negative and phase elements to implement a staged evaluation for fault detection and direction determination based on an automatically selecting of the torque to be used. In particular, logic algorithm 200 includes a ground element logic circuit 202, a negative element logic circuit 204 and a phase element logic circuit 206 for detecting a fault in the direction of side X or in the direction of side Y.

Figure 3A:
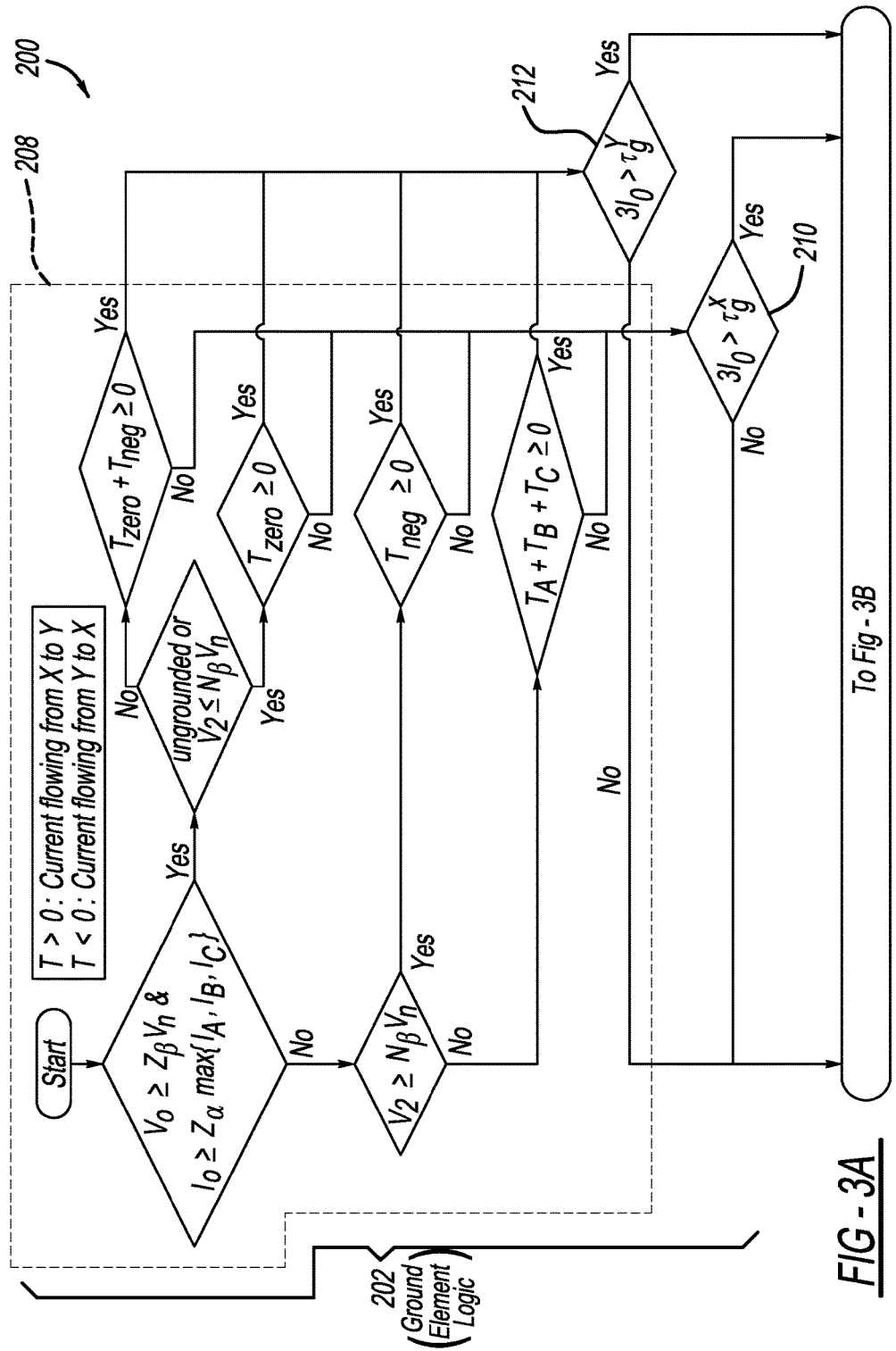
FIG. 3A is a flow chart showing the ground element logic algorithm executed by the directional element for fault detection and direction determination.
Figure 3B:
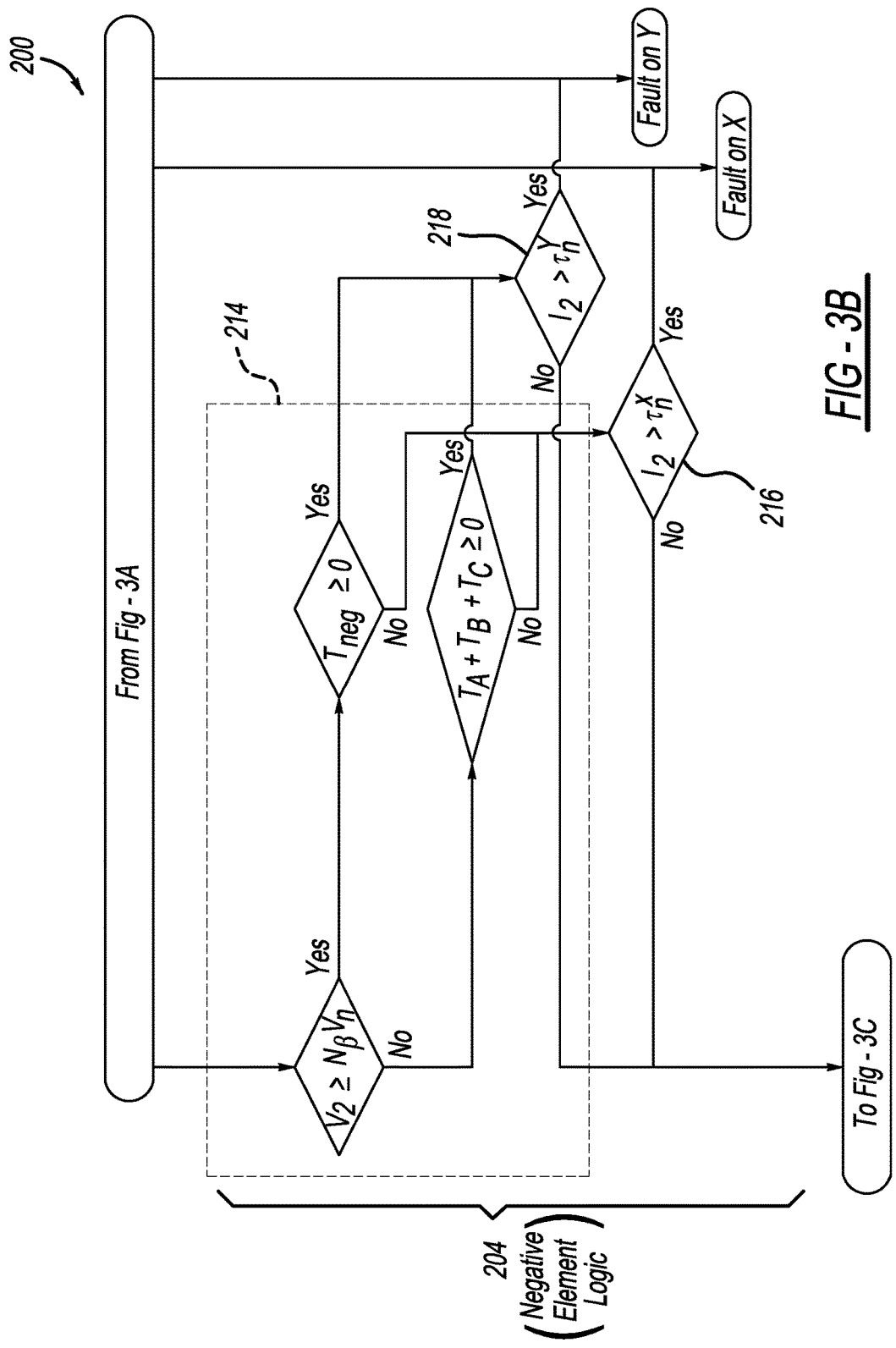
FIG. 3B is a flow chart showing the negative element logic algorithm executed by the directional element for fault detection and direction determination.

With reference now to FIG. 3A, after querying the operational state of the electric power generation system 10, the ground element logic circuit 202 evaluates the phase torques ($T_A$, $T_B$, $T_C$), zero sequence torque ($T_{zero}$) and negative sequence torque ($T_{neg}$) as indicated at block 208 to determine the direction of a potential fault. For example, a potential fault may exist on side X when ($T_{zero} + T_{neg}$) or ($T_{zero}$) or ($T_{neg}$) or ($T_A + T_B + T_C$)<0. Conversely, a potential fault may exist on side Y when ($T_{zero} + T_{neg}$) or ($T_{zero}$) or ($T_{neg}$) or ($T_A + T_B + T_C$)≥0. Once the direction of a potential fault is determine, the ground element logic circuit 202 is configured to indicate a fault condition in the direction of side X when a multiple of the magnitude for the ground current ($3I_0$) is greater than the overcurrent ground threshold value for side X ($\tau_g^x$) at block 210. Similarly, a fault condition in the direction of side Y is indicated when a multiple of the magnitude for the ground current ($3I_0$) is greater than the overcurrent ground threshold value for side Y ($\tau_g^y$) at block 212. If a fault is not detected in accordance with the ground element logic circuit 202, logic algorithm 200 proceeds to the negative element logic circuit 204 as shown in FIG. 3B.

The negative element logic circuit 204 again queries the operational state of the electric power generation system 10, then evaluates the phase torques ($T_A$, $T_B$, $T_C$) and the negative sequence torque ($T_{neg}$) at block 214 to determine the direction of a potential fault. For example, a potential fault may exist on side X when ($T_{neg}$) or ($T_A + T_B + T_C$)<0. Conversely, a potential fault may exist on side Y when ($T_{neg}$) or ($T_A + T_B + T_C$)≥0. Once the direction of a potential fault is determine, the negative element logic circuit 204 is configured to indicate a fault condition in the direction of side X when the magnitude for the negative sequence current ($I_2$) is greater than the overcurrent negative threshold value for side X ($\tau_n^x$) at block 216. Similarly, a fault in the direction of side Y is detected when the magnitude for the negative sequence current ($I_2$) is greater than the overcurrent negative threshold value for side Y ($\tau_n^y$) at block 218. If a fault condition is not detected in accordance with the negative element logic circuit 204, logic algorithm 200 proceeds to the phase element logic circuit 206 as shown in FIGS. 3C-3E.

Figure 3C:
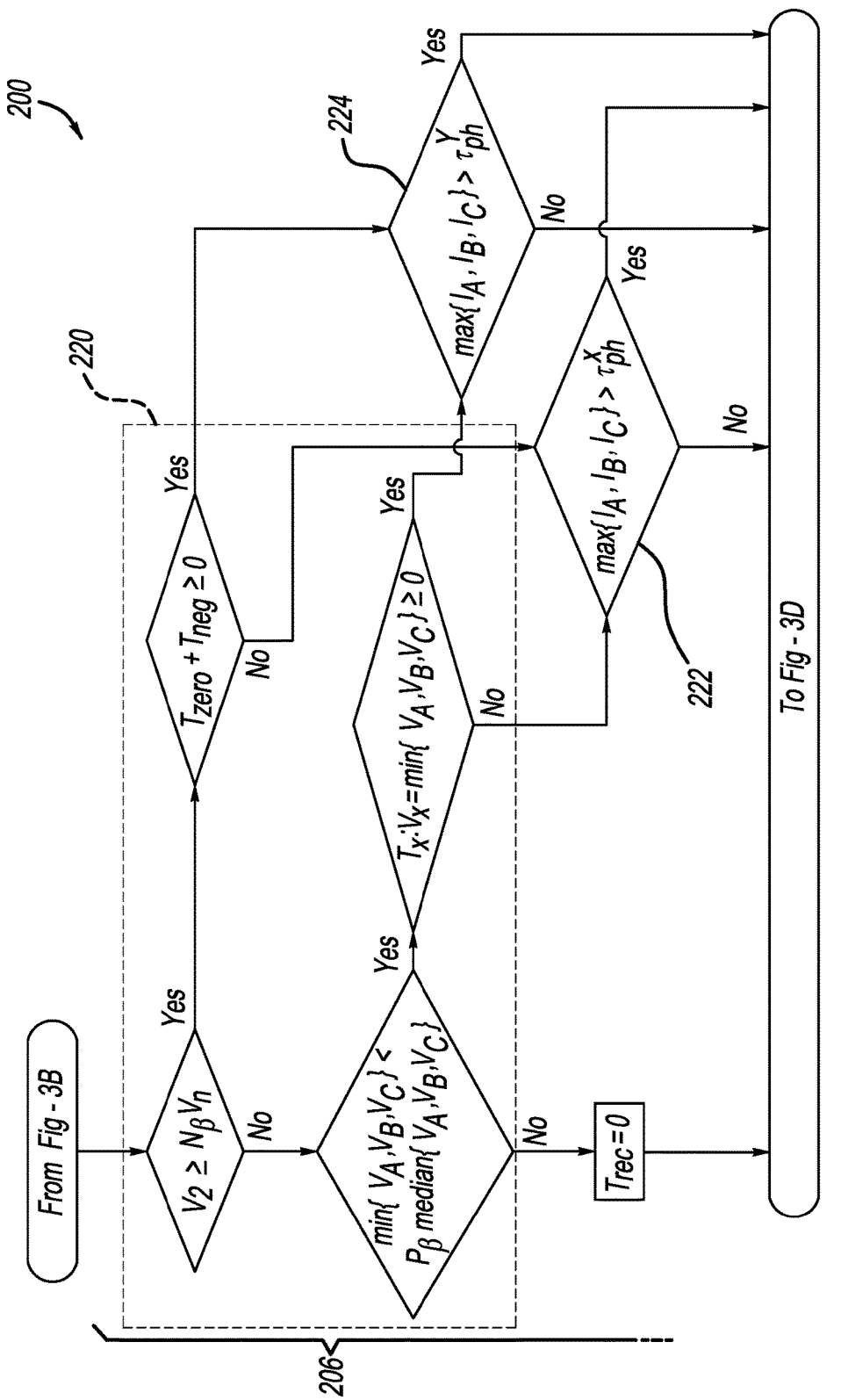

With reference now to FIG. 3C, the phase element logic circuit 206 again queries the operational state of the electric power generation system 10, then evaluates the phase torques ($T_A$, $T_B$, $T_C$) and the negative sequence torque ($T_{neg}$) at block 220 to determine the direction of a potential fault. For example, a potential fault may exist on side X when ($T_{zero} + T_{neg}$) or ($T_{x:Vx} = \min(V_A, V_B, V_C)$)<0. Conversely, a potential fault may exist on side Y when ($T_{zero} + T_{neg}$) or ($T_{x:Vx} = \min(V_A, V_B, V_C)$)≥0. Once the direction of a potential fault is determined, the phase element logic circuit 206 evaluates the fault condition based on a maximum current for all of the phases. Specifically, the phase element logic circuit 206 will indicate a fault condition in the direction of side X when the maximum value of the magnitude for any of the phasor currents (max($I_A$, $I_B$, $I_C$)) is greater than the overcurrent phase threshold value for side X ($\tau_{ph}^x$) at block 222. Similarly, a fault condition in the direction of side Y is indicated when the maximum value of the magnitude for any of the phasor value currents (max($I_A$, $I_B$, $I_C$)) is greater than the overcurrent phase threshold value for side Y ($\tau_{ph}^y$) at block 224.

As shown in FIG. 3D, if a fault condition is not detected based on the maximum value of the magnitude for any of the phasor value currents, phase element logic circuit 206 proceeds to evaluate the phase torques ($T_A$, $T_B$, $T_C$) based on each of the phasor currents at blocks 226, 228, 230. For example, in block 226 a potential fault may exist on side X when ($T_{Amin}$) or ($T_{Amax}$)<0 and when the magnitude of the phasor currents ($I_A$) is greater than the overcurrent phase threshold value for side X ($\tau_{ph}^x$). Conversely, a potential fault may exist on side Y when ($T_{Amin}$) or ($T_{Amax}$)≥0 and when the magnitude of the phasor currents ($I_A$) is greater than the overcurrent phase threshold value for side Y ($\tau_{ph}^y$). The evaluation in blocks 228, 230 is essentially as executed in block 226 except that it is carried out on a different phase, and thus need not be further described herein.

Figure 3E:
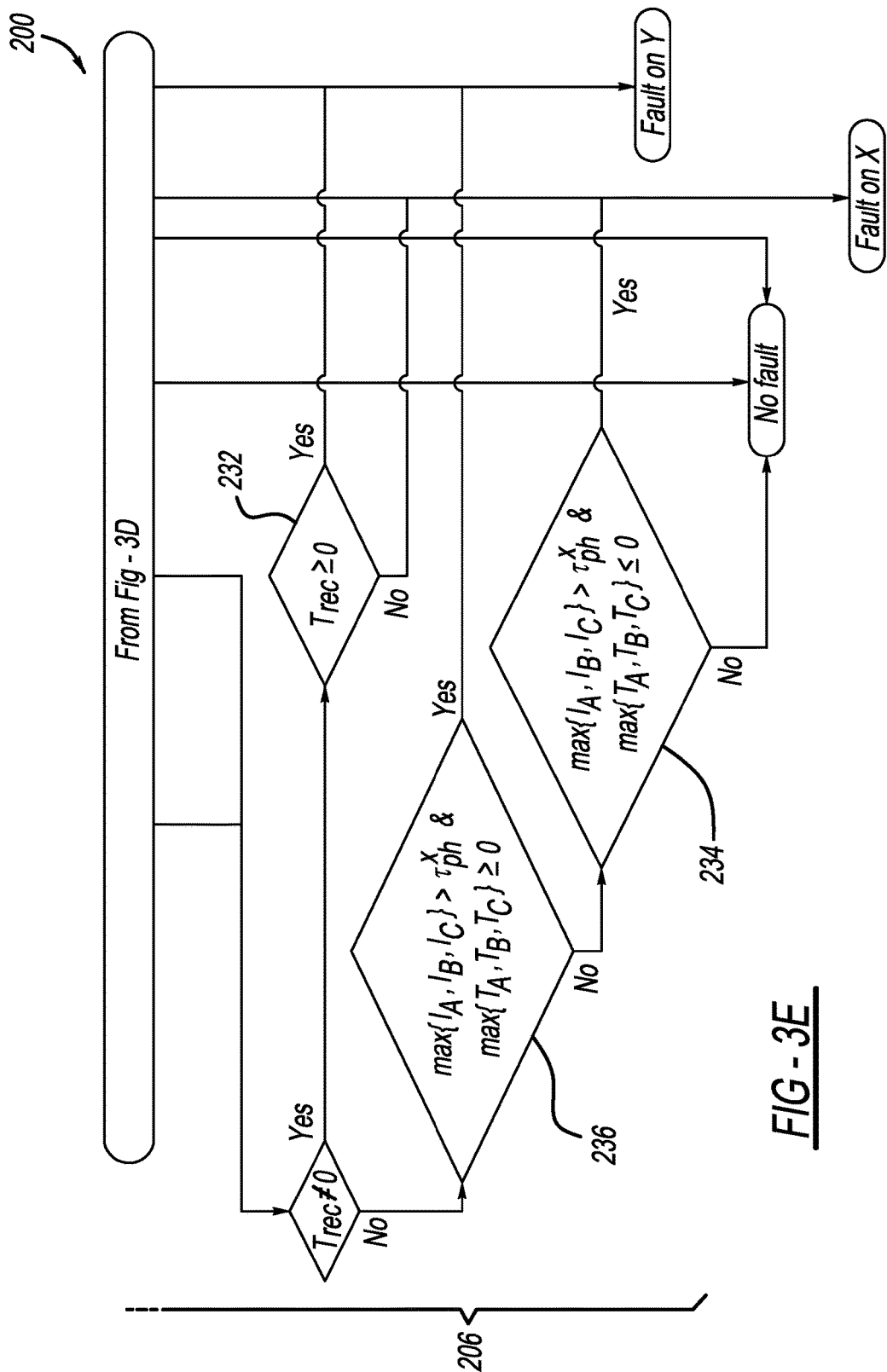

As shown in FIG. 3E, a fault condition in the direction of side X may be indicated when the summation of the phase torques ($T_A$, $T_B$, $T_C$) is less than zero as indicated at block 232 or when the maximum value of the magnitude for any of the phasor currents (max($I_A$, $I_B$, $I_C$)) is greater than the overcurrent phase threshold value for side X ($\tau_{ph}^x$) and the maximum value of any phase torque value (max($T_A$, $T_B$, $T_C$)) is less than or equal to zero as indicated at block 234. Similarly, a fault condition in the direction of side Y may be indicated when the summation of the phase torques ($T_A$, $T_B$, $T_C$) is equal to or greater than zero as indicated at block 232 or when the maximum value of the magnitude for any of the phasor currents (max($I_A$, $I_B$, $I_C$)) is greater than the overcurrent phase threshold value for side Y ($\tau_{ph}^y$) and the minimum value of any phase torque value (min($T_A$, $T_B$, $T_C$)) is equal to or greater than zero as indicated at block 236. If none of these conditions are satisfied, then a fault condition has not been detected.

From the present disclosure, one skilled in the art will appreciate that implementation of logic algorithm 200 in the directional element 22 provides several distinct advantages over conventional fault detection and direction determination algorithms. For example, forward and reverse direction of phase torques are defined by restricted slices controlled by $MTA_{min}$ and $MTA_{max}$. From FIGS. 3A-3E, it is clear that logic algorithm 200 establishes precedence between the ground, negative and phase elements for fault detection and direction determination. As represented in FIG. 3A-3E, logic algorithm 200 only uses the sequence torques to detect fault and determine direction when the signal-to noise ratio of sequence voltage and current is high enough as controlled by $Z_\alpha$, $Z_\beta$ and determined by the sensor noise level. As shown in FIGS. 3C-3E, phase element logic circuit 206 allows a single phase torque to determine the direction of a fault under certain conditions. As shown in FIGS. 3C-3E, when a phase voltage is significantly lower than other phase voltages, phase element logic circuit 206 uses the phase torque of the phase with the lowest voltage to determine the fault direction. Phase element logic circuit 206 also enables the use of the negative sequence to choose whether the negative sequence torque or the phase torque determined the fault direction as shown in FIG. 3C-3E.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method of fault detection and direction determination in a three-phase electric power distribution system including a grid having a first source on a first side of the grid and a second source on a second side of the grid, the method comprising:

measuring a current and voltage for each of the three power phases at a location between the first and second side to determine an operational state of the electric power distribution system including a zero sequence torque, a ground current, a negative sequence torque, a negative sequence current, and a phase torque and a phasor current for each of the three phases;

evaluating the operational state using a ground element logic algorithm to indicate a first fault condition in a direction of the first side when at least one of the zero sequence torque, the negative sequence torque or a sum of the phase torques is less than zero and a magnitude for the ground current is greater than an overcurrent ground threshold value for the first side, a second fault condition in a direction of the second side when at least one of the zero sequence torque, the negative sequence torque or the sum of the phase torques is greater than zero and the magnitude for the ground current is greater than the overcurrent ground threshold value for the second side, and a no fault condition when neither the first or second fault condition is indicated;

evaluating the operational state using a negative element logic algorithm to indicate the first fault condition when the negative sequence torque is less than zero and the magnitude for the negative sequence current is greater than an overcurrent negative threshold value for the first side, the second fault condition when the negative sequence torque is greater than zero and the magnitude for the negative sequence current is greater than an overcurrent negative threshold value for the second side, and the no fault condition when neither the first or second fault condition is indicated; and evaluating the operation state using a phase element logic algorithm to indicate the first fault condition when any one of the three phase torques is less than zero and a maximum value of the magnitude of the phasor current for any one of the three phases is greater than an overcurrent phase threshold value for the first side, the second fault condition when any one of the three phase torques is greater than zero and the maximum value of the magnitude the phasor current for any one of the three phases is greater than an overcurrent phase threshold value for the second side, and the no fault condition when neither the first or second fault condition is indicated.

2. The method of fault detection and direction determination according to claim 1 further comprises evaluating the operation state using the phase element logic algorithm to indicate the first fault condition when a summation of the phase torques for each of the phases is less than zero or when the maximum value of the magnitude for any one of the three phasor currents is greater than the overcurrent phase threshold value for the first side and a maximum value of any phase torque value is less than or equal to zero.

3. The method of fault detection and direction determination according to claim 2 further comprises evaluating the operation state using the phase element logic algorithm to indicate the second fault condition when the summation of the phase torques for each of the phases is equal to or greater than zero or when the maximum value of the magnitude for any one of the three phasor currents is greater than the overcurrent phase threshold value for the second side and a minimum value of any phase torque value is equal to or greater than zero.

4. A directional element for fault detection and direction determination in a three-phase electric power distribution system including a grid having a first source on a first side of the grid and a second source on a second side of the grid, the directional element comprising:
   a sensor element configured to measure current and voltage for each of the three power phases at a location between the first and second side and determine an operational state of the electric power distribution system including a zero sequence torque, a ground current, a negative sequence torque, a negative sequence current, and a phase torque and a phasor current for each of the three phases;
   a ground element logic circuit configured to indicate a first fault condition in a direction of the first side when at least one of the zero sequence torque, the negative sequence torque or a sum of the phase torques is less than zero and a magnitude for the ground current is greater than an overcurrent ground threshold value for the first side, a second fault condition in a direction of the second side when at least one of the zero sequence torque, the negative sequence torque or the sum of the phase torques is greater than zero and the magnitude for the ground current is greater than the overcurrent ground threshold value for the second side, and a no fault condition when neither the first or second fault condition is indicated;
   a negative element logic circuit configured to indicate the first fault condition when the negative sequence torque is less than zero and the magnitude for the negative sequence current is greater than an overcurrent negative threshold value for the first side, the second fault condition when the negative sequence torque is greater than zero and the magnitude for the negative sequence current is greater than an overcurrent negative threshold value for the second side, and the no fault condition when neither the first or second fault condition is indicated; and
   a phase element logic circuit to indicate the first fault condition when any one of the three phase torques is less than zero and a maximum value of the magnitude of the phasor current for any one of the three phases is greater than an overcurrent phase threshold value for the first side, the second fault condition when any one of the three phase sequence torques is greater than zero and the maximum value of the magnitude the phasor current for any one of the three phases is greater than an overcurrent phase threshold value for the second side, and the no fault condition when neither the first or second fault condition is indicated.

5. The directional element according to claim 4, wherein the phase element logic circuit is further configured to indicate the first fault condition when a summation of the phase torques is less than zero or when the maximum value of the magnitude for any one of the three phasor currents is greater than the overcurrent phase threshold value for the first side and a maximum value of any phase torque is less than or equal to zero.

6. The directional element according to claim 5, wherein the phase element logic circuit is further configured to indicate the second fault condition when the summation of the phase torques is equal to or greater than zero or when the maximum value of the magnitude for any one of the three phasor currents is greater than a overcurrent phase threshold value for the second side and a minimum value of any phase torque is equal to or greater than zero.

* * * * *